(12) United States Patent
Savandaiah et al.

(10) Patent No.: US 12,509,756 B2
(45) Date of Patent: Dec. 30, 2025

(54) REDUCED SUBSTRATE PROCESS CHAMBER CAVITY VOLUME

(71) Applicant: Applied Materials, Inc., Santa Clara, CA (US)

(72) Inventors: Kirankumar Neelasandra Savandaiah, Bangalore (IN); Srinivasa Rao Yedla, Bangalore (IN); Thomas Brezoczky, Los Gatos, CA (US); Nitin Bharadwaj Satyavolu, Kakinada (IN)

(73) Assignee: Applied Materials, Inc., Santa Clara, CA (US)

( * ) Notice: Subject to any disclaimer, the term of this patent is extended or adjusted under 35 U.S.C. 154(b) by 801 days.

(21) Appl. No.: 17/147,262

(22) Filed: Jan. 12, 2021

(65) Prior Publication Data

US 2022/0223367 A1  Jul. 14, 2022

(51) Int. Cl.
*H01J 37/34* (2006.01)
*C23C 14/00* (2006.01)
*C23C 16/458* (2006.01)
*H01J 37/32* (2006.01)

(52) U.S. Cl.
CPC ...... *C23C 14/0063* (2013.01); *C23C 16/4585* (2013.01); *H01J 37/32449* (2013.01); *H01J 37/32458* (2013.01); *H01J 37/32651* (2013.01); *H01J 37/32807* (2013.01); *H01J 37/32816* (2013.01); *H01J 37/3411* (2013.01); *H01J 37/3488* (2013.01)

(58) Field of Classification Search
CPC .............. H01J 37/3417; H01J 37/3411; H01J 37/3488; H01J 37/32651; H01J 37/32807; H01J 37/32816; H01J 37/32458; H01J 37/32449; H01L 21/67167; C23C 14/0063; C23C 16/4585
See application file for complete search history.

(56) References Cited

U.S. PATENT DOCUMENTS

| 4,440,618 A | * | 4/1984 | Suzuki ..................... H01J 37/34 204/298.03 |
| 9,322,092 B2 | * | 4/2016 | Yamaguchi ......... H01J 37/3417 |
| 2014/0346037 A1 | * | 11/2014 | Mizuno ................. H01J 37/345 204/298.08 |
| 2019/0096638 A1 | * | 3/2019 | Lavitsky ............... C23C 14/351 |
| 2022/0098724 A1 | * | 3/2022 | Wenz ................... H01J 37/3411 |

* cited by examiner

*Primary Examiner* — Michael A Band
(74) *Attorney, Agent, or Firm* — Patterson + Sheridan, LLP

(57) ABSTRACT

Aspects of the present disclosure relate to systems and apparatuses for a substrate processing assembly with a low processing volume. In disclosed embodiments, a processing volume may include a processing space adjacent to a substrate being processed on a substrate support as well as a volume of the processing chamber surrounding and below the substrate support. In some embodiments, the total processing volume is 15 liters or less in certain embodiments, resulting in lower gas usage and faster processing times than conventional approaches. In some embodiments, the distance between the substrate and a target, electrode, chamber lid, or showerhead face is 35 mm or less in certain embodiments. In certain embodiments, the processing chamber has a dedicated pump for pumping the chamber to a processing pressure as well as evacuating the chamber after processing of the substrate.

20 Claims, 3 Drawing Sheets

REDUCED SUBSTRATE PROCESS CHAMBER CAVITY VOLUME

BACKGROUND

Field

Embodiments of the present invention generally relate to a semiconductor processing chamber, and more particularly to semiconductor processing chambers having a small processing volume.

Description of the Related Art

Substrate processing chambers for processes such as with a reactive physical vapor deposition (PVD) process, an atomic layer deposition (ALD) process, a chemical vapor deposition (CVD) process, an etch process, a thermal process, a plasma ion implant process, reactive gas process, or other processes, conventionally have relatively large processing volumes. In addition to the volume of a processing space adjacent to a substrate being processed, the entirety of a conventional processing volume includes a volume beneath the substrate support, that typically includes ports for vacuum pumps and inlets for one or more gases used in processing and/or cleaning the chamber. Conventionally, such processing volumes may exceed 40 liters, most of which is not part of the processing space.

As a result of a relatively large processing volume, conventional processing chambers are expensive to operate. Sufficient amounts of gas that may be required for substrate processing fill not only the processing space but the processing volume, resulting in significant amounts of gas that are unused and discarded after a processing cycle.

Moreover, due to relatively large processing volumes, substrate processing time is increased as well. At scale, pumping times needed to fill a chamber with enough gas, and subsequent evacuation of that gas after processing may take 15 seconds or more for a full processing cycle for a substrate. Over thousands of substrates, the time needed to fill and evacuate a chamber is significant.

What is needed are systems and apparatus to overcome the deficiencies of conventional approaches.

SUMMARY

Certain embodiments generally related to an apparatus for processing a substrate are disclosed that include a shield, a process kit support, and a substrate support. These embodiments include a process volume defined by the shield and the process kit support having a volume of 20 liters or less, and an upper gas inlet positioned above the substrate support in fluid communication with a gas source.

Further embodiments disclose an apparatus for processing a substrate that include a target, and a substrate support positioned 40 mm or less from the target. These embodiments include a process volume containing the substrate support, the process volume defined by a shield and a process kit support of less than 20 liters, and a plurality of gas inlets, a first one of the plurality of gas inlets positioned adjacent to the target, and a second one of the plurality of gas inlets positioned adjacent to the substrate support.

In further embodiments an apparatus for processing a substrate is disclosed, that includes a shield, and a process kit support. Such embodiments further include a process volume defined by the shield and process kit support, and a pump coupled to the process volume, configured to cycle pressure of the process volume from a pre-process pressure to a process pressure and back to the pre-process pressure in less than 5 seconds.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
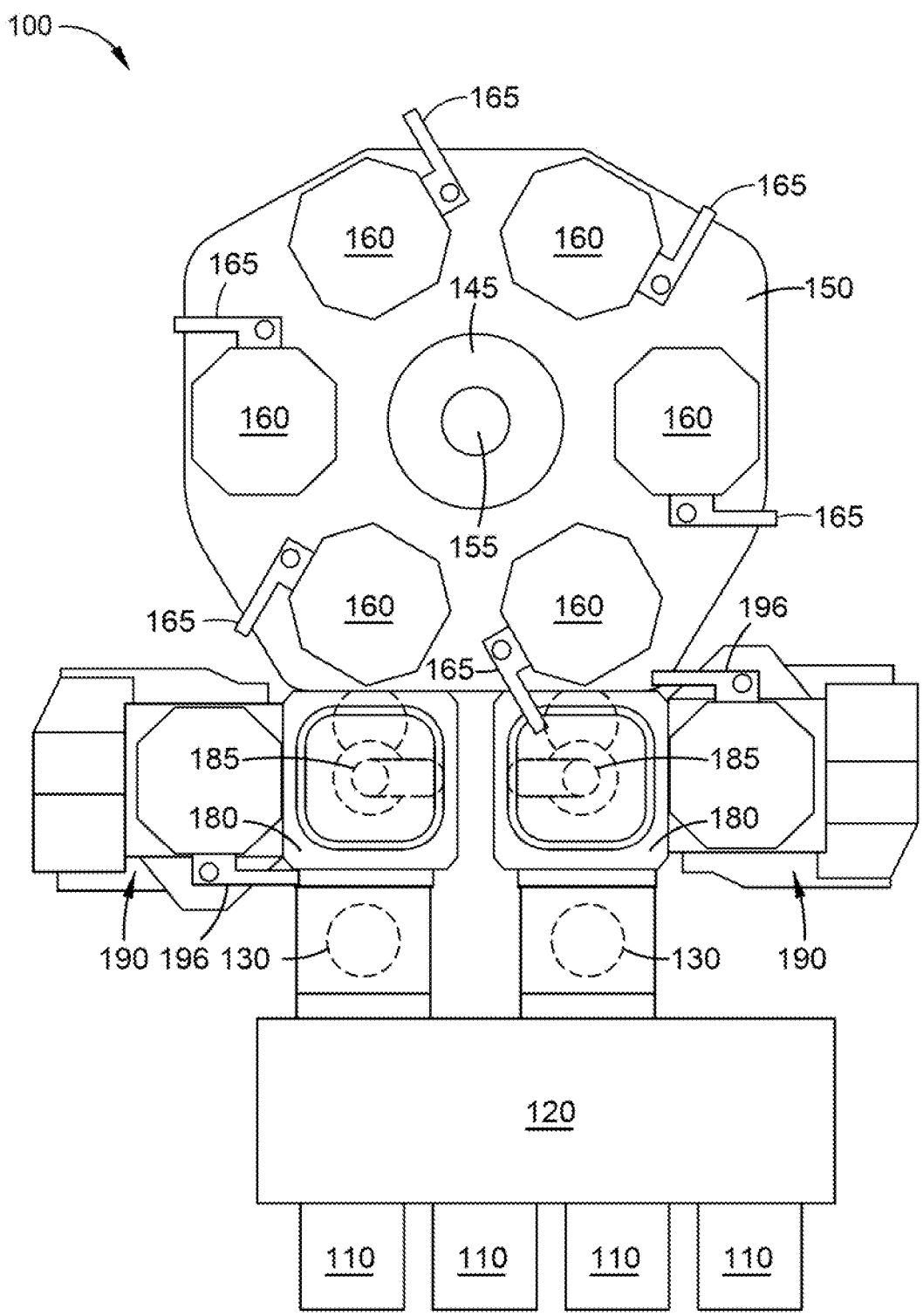
FIG. 1 is a plan view of a cluster tool assembly according to certain embodiments.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

Aspects of the present disclosure relate to systems and apparatuses for a substrate processing assembly with a low processing volume. In disclosed embodiments, a processing volume may include a processing space adjacent to a substrate being processed on a substrate support as well as a volume of the processing chamber surrounding and below the substrate support. In some embodiments, the total processing volume is 15 liters or less in certain embodiments, resulting in lower gas usage and faster processing times than conventional approaches. In some embodiments, the distance between the substrate and a target, electrode, chamber lid, or showerhead face is 35 mm or less in certain embodiments. In certain embodiments, the processing chamber has a dedicated pump for pumping the chamber to a processing pressure as well as evacuating the chamber after processing of the substrate.

Embodiments of the present disclosure are directed towards apparatus for substrate processing and a cluster tool including a transfer chamber assembly and a plurality of processing assemblies. The transfer chamber assembly and processing assemblies may include processing platforms for ALD, CVD, PVD, etch, cleaning, implanting, heating, annealing, and/or polishing processes. Other processing platforms may also be used with the present disclosure. The present disclosure generally provides a substrate processing tool with increased process condition flexibility between process assemblies within the same cluster tool.

In conventional approaches, substrate processing assemblies have relatively large processing volumes, including a processing space adjacent to a substrate support, as well as a substantially lower volume beneath the substrate support. Conventionally, gas is provided to the processing space by injecting into the lower volume, and once full, the gas moves into the processing space. As conventional volumes may exceed 40 liters, a substantial amount of processing gas is required fill the processing volume with processing gas, most of which is not used. Moreover, evacuating the process volume and pumping the processing volume down to a processing pressure may take a substantial amount of time. The entire process to fill a substrate processing assembly with gas, evacuate the used gases, pump down, and refill may take 15 seconds or longer.

Conventionally, the primary way to control gas flow from the lower volume to the processing space is by moving the substrate support relative to an electrode, thereby changing an annular gap coupling the lower volume and the processing space.

According to systems and apparatuses disclosed herein, a reduced processing volume is provided, being 20 liters or less, and in some embodiments, 15 liters or less. One or more gases may be provided directly to a processing space by an upper gas inlet located between an upper shield and an electrode, as well as from a lower processing volume via an annular gap formed between a lower shield and a substrate holder. By enabling injection of gas directly to a processing space from the upper gas inlet, disclosed embodiments may adjust the height of the substrate support to any desired distance from the electrode. Moreover, a pumpdown pump dedicated to a single substrate processing assembly is provided. By providing a reduced processing volume and dedicated pumpdown, pump cycling time for processing a substrate according to disclosed embodiments may take less than 5 seconds in some embodiments and less than 3 seconds in certain embodiments.

By providing rapid pump cycling of the substrate processing assembly, certain embodiments further include the ability for the substrate processing assembly to perform self a self-cleaning process. In conventional approaches with 40 liter process volumes, self-cleaning would require too much time to exhaust the chamber, pump up to the required pressure, introduce reactive or non-reactive cleaning gases, and pump down to efficiently clean a chamber as part of a manufacturing process. By using embodiments disclosed herein, a cleaning process may be efficiently performed as pump cycling the substrate processing assembly may be done in under 15 seconds.

The present disclosure includes embodiments for substrate processing. A substrate and optionally a support chuck may be transported between processing assemblies within a transfer volume formed by a transfer chamber assembly. The processing assemblies include processing volumes in which the substrate is processed. The support chuck may optionally detach from a lift assembly while being transported between processing assemblies. When the substrate and the support chuck are disposed on the lift assembly, the lift assembly raises the substrate and support chuck to an upper processing position. While in the upper processing position, surfaces of the processing assembly and the support chuck seal against one another to form a fluidly isolated processing volume. The processing volume is fluidly isolated from the transfer volume formed by the transfer chamber assembly.

The isolation of the processing volume from the transfer volume by the movement of the lift assembly allows for each of the processing volumes to be adjusted to different pressures. This enables different substrate processing steps to be performed within each of the processing assemblies within the transfer chamber assembly, even when each processing step requires different pressures and temperatures. The use of the support chuck as the sealing member within the processing assembly also minimizes the volume of the processing volume. Minimizing the processing volume decreases the amount of process gases and purge gases required during each process. The sealing between each processing volume and the transfer volume additionally minimizes process gas leakage into the transfer chamber. The apparatus and method utilized to create the seal between the processing volumes and the transfer volume minimize particle contamination within the processing volumes and decrease downtime of the apparatus caused by part replacement and cleaning.

Figure 2:
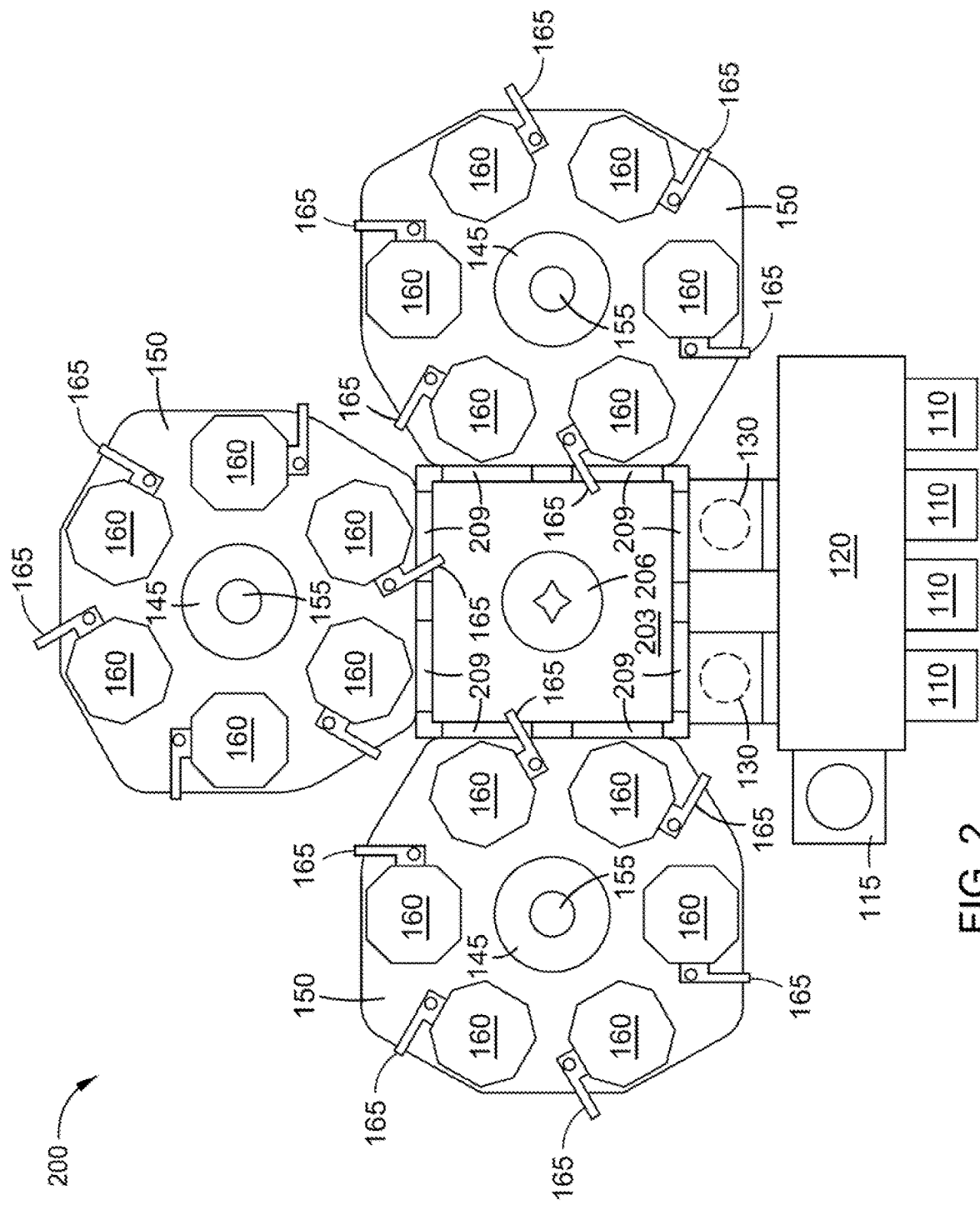
FIG. 2 is a plan view of a cluster tool assembly having a plurality of transfer chamber assemblies, according to certain embodiments.

FIGS. 1 and 2 are plan views of cluster tool assemblies 100, 200 with transfer chamber assemblies 150 and substrate processing assemblies 160 as described herein. The cluster tool assembly 100 of FIG. 1 includes a single transfer chamber assembly 150 and a plurality of front end robot chambers 180 between the transfer chamber assembly 150 and load lock chambers 130. The cluster tool assembly 200 of FIG. 2 includes multiple transfer chamber assemblies 150 and a buffer chamber 203 disposed between the transfer chamber assemblies 150 and load lock chambers 130.

In FIG. 1, the cluster tool assembly 100 includes Front Opening Unified Pods (FOUPs) 110, a Factory Interface (FI) 120 adjacent to and operably connected to the FOUPs 110, load lock chambers 130 adjacent to and operably connected to the FI 120, front end robot chambers 180 adjacent to and operatively connected to the load lock chambers 130, prep chambers 190 adjacent to and operatively connected to the front end robot chambers 180, and a transfer chamber assembly 150 connected to the front end robot chambers 180.

The FOUPs 110 are utilized to safely secure and store substrates during movement thereof between different substrate processing equipment, as well as during the connection of the FOUPs to the substrate processing equipment while the substrates are disposed therein. The number of FOUPs 110 (four shown) may vary in quantity depending upon the processes run in the cluster tool assembly 100. The throughput of the cluster tool assembly 100 also, at least in part, defines the number of docking stations on the FI 120 to which the FOUPs are connected for the unloading of substrates therefrom and the loading of substrates thereinto. The FI 120 is disposed between the FOUPs 110 and the load lock chambers 130. The FI 120 creates an interface between a semiconductor fabrication facility (Fab) and the cluster tool assembly 100. The FI 120 is connected to the load lock chambers 130, such that substrates are transferred from the FI 120 to the load lock chambers 130 and from the load lock chambers 130 and into the FI 120.

The front end robot chambers 180 are located on the same side of each of the load lock chambers 130, such that the load lock chambers 130 are located between the FI 120 and the front end robot chambers 180. The front end robot chambers 180 each include a transfer robot 185 therein. The transfer robot 185 is any robot suitable to transfer one or more substrates from one chamber to another, through or via the front end robot chamber 180. In some embodiments, as shown in FIG. 1, the transfer robot 185 within each front end robot chamber 180 is configured to transport substrates from one of the load lock chambers 130 and into one of the prep chambers 190.

The prep chambers 190 may be any one of a pre-clean chamber, an anneal chamber, or a cool down chamber, depending upon the desired process within the cluster tool assembly 100. In some embodiments, the prep chambers 190 are plasma clean chambers. In yet other exemplary embodiments, the prep chambers 192 are Preclean II chambers available from Applied Materials, Inc., of Santa Clara, Calif. A vacuum pump 196 is positioned adjacent to each of the prep chambers 192. The vacuum pumps 196 are configured to pump the prep chambers 190 to a predetermined pressure. In some embodiments, the vacuum pump 196 is configured to decrease the pressure of the prep chamber 192, such as to create a vacuum within the prep chamber 192.

As shown in FIG. 1, two load lock chambers 130, two front end robot chambers 180, and two prep chambers 190 are configured within the cluster tool assembly 100. The two load lock chambers 130, the two front end robot chambers 180, and the two prep chambers 190, when arranged as shown in FIG. 1 and described above, may form two transport assemblies. The two transport assemblies may be spaced from each other and may form mirror images of one another, such that the prep chambers 190 are on opposite walls of their respective front end robot chambers 180.

The transfer chamber assembly 150 is adjacent to, and operatively connected to, the front end robot chambers 180, such that substrates are transferred between the transfer chamber assembly 150 and front end robot chambers 180. The transfer chamber assembly 150 includes a central transfer device 145 and a plurality of substrate processing assemblies 160 therein. The plurality of substrate processing assemblies 160 is disposed around the central transfer device 145, radially outward of a pivot or central axis of the central transfer device 145 in the transfer chamber assembly 150.

A chamber pump 165 is disposed adjacent to, and in fluid communication with, each of the substrate processing assemblies 160, such that there is a plurality of chamber pumps 165 disposed around the central transfer device 145. The plurality of chamber pumps 165 are disposed radially outward of the central transfer device 145 in the transfer chamber assembly 150. As shown in FIG. 1, one chamber pump 165 is fluidly coupled to each of the substrate processing assemblies 160.

In some embodiments, there may be multiple chamber pumps 165 fluidly coupled to each substrate processing assembly. In yet other embodiments, one or more of the substrate processing assemblies 160 may not have a chamber pump 165 directly fluidly coupled thereto. In some embodiments, a varying number of chamber pumps 165 are fluidly coupled to each substrate processing assembly 160, such that one or more substrate processing assemblies 160 may have a different number of chamber pumps 165 than one or more other substrate processing assemblies 160. The chamber pumps 165 enable separate vacuum pumping of processing regions within each substrate processing assembly 160, and thus the pressure within each of the processing assemblies may be maintained separately from one another and separately from the pressure present in the transfer chamber assembly 150.

FIG. 1 depicts an embodiment having six substrate processing assemblies 160 within the transfer chamber assembly 150. However, other embodiments may have a different number of substrate processing assemblies 160 within the transfer chamber 150. For example, in some embodiments, two to twelve substrate processing assemblies 160 may be positioned within the transfer chamber assembly 150, such as four to eight substrate processing assemblies 160. In other embodiments, four substrate processing assemblies 160 may be positioned within the transfer chamber assembly 150. The number of substrate processing assemblies 160 impacts the total footprint of the cluster tool 100, the number of possible process steps capable of being performed by the cluster tool 100, the total fabrication cost of the cluster tool 100, and the throughput of the cluster tool 100.

Each of the substrate processing assemblies 160 can be any one of PVD, CVD, ALD, etch, cleaning, heating, annealing, and/or polishing platforms. In some embodiments, the substrate processing assemblies 160 are all one type of processing platform. In other embodiments, the substrate processing assemblies 160 includes two or more different processing platforms. In one exemplary embodiment, all of the substrate processing assemblies 160 are PVD process chambers. In another exemplary embodiment, the substrate processing assemblies 160 includes both PVD and CVD process chambers. The plurality of substrate processing assemblies 160 can be altered to match the types of process chambers needed to complete a semiconductor fabrication process.

The central transfer device 145 is disposed at generally the center of the transfer chamber assembly 150, such that a central axis 155 of the transfer chamber assembly 150 is disposed through the central transfer device 145. The central transfer device 145 is any suitable transfer device configured to transport substrates between each of the substrate processing assemblies 160. In one embodiment, the central transfer device 145 is a central robot having one or more blades configured to transport substrates between each substrate processing assembly 160. In another embodiment, the central transfer device is a carousel system by which processing regions are moved along a circular orbital path centered on the central axis 155 of the transfer chamber assembly 150.

FIG. 2 is a plan view of the cluster tool 200 with multiple transfer chamber assemblies 150 connected thereto. The FOUPs 110, FI 120, and load lock chambers 130 may be arranged similarly to the FOUPs 110, FI 120, and load lock chambers 130 described above in relation to FIG. 1. The cluster tool 200 of FIG. 2 further includes an FI etch apparatus 115, a buffer chamber 203, and a plurality of transfer chamber assemblies 150.

The FI etch apparatus 115 is positioned adjacent to the FI 120, such that the FI etch apparatus 115 is disposed on a side wall of the FI 120. The FI etch apparatus 115 may be positioned on a side wall of the FI 120 that is separate from the side walls of the FI that are connected to the FOUPs 110 and the load lock chambers 130. The FI etch apparatus 115 may be an etch chamber. The FI etch apparatus 115 may be similar to the Centris® line of etch chambers available from Applied Materials, Inc.

The buffer chamber 203 is located between the load lock chambers 130 and the plurality of transfer chamber assemblies 150 and provides an isolatable volume through which substrates may be transferred among and between the load lock chambers 130 and the multiple transfer chamber assemblies 150. The buffer chamber 203 is coupled to both the load lock chambers 130 and the plurality of transfer chamber assemblies 150. As shown in FIG. 2, three transfer chamber assemblies 150 are disposed around and attached to the buffer chamber 203. In other embodiments, there may be one, two, or more than three transfer chamber assemblies 150 disposed around the buffer chamber 203.

The buffer chamber 203 includes at least one opening 209 along each wall of the buffer chamber 203 that is in contact with a transfer chamber assembly 150 or a load lock chamber 130. Each of the openings 209 is sized to allow the passage of a substrate, a substrate chuck, or a substrate on a substrate chuck to and from the transfer chamber assemblies 150. In some embodiments, there are two openings 209 along each wall of the buffer chamber 203 that is adjacent to the transfer chamber assemblies 150. This allows for the passage of two substrates to the transfer chamber assemblies 150 from the buffer chamber 203 or from the transfer chamber assemblies 150 to the buffer chamber 203 simultaneously.

The buffer chamber 203 includes one or more buffer chamber transfer robots 206. The buffer chamber transfer robots 206 move substrates, chucks, or both substrates and chucks between the transfer chamber assemblies 150 and the load lock chambers 130. The buffer chamber transfer robots 206 may be any suitable substrate transfer robot.

To enable isolation of the buffer chamber 203 internal volume from process gases used in the process assemblies 160 of the transfer chamber assemblies 150, access between each transfer chamber assembly 150, and the openings 209 in the buffer chamber 203 are selectively sealed by a respective fluid isolation valve, such as a slit valve. The fluid isolation valves (not shown) are disposed within the wall of each of the transfer chamber assemblies 150, the wall of the buffer chamber 203, or as a separate assembly between the buffer chamber 203 and the transfer chamber assembly 150. Additionally, the fluid isolation valves may include a plate and seal assembly which is pressed by a selectively operable ram to selectively cover and seal, or uncover, the respective opening 209. The plate and seal assembly thereby selectively seals, or allows, fluid communication between the transfer chamber assembly 150 and the buffer chamber 203 and also allows, when retracted away from an opening 209, a support blade or end effector on the buffer chamber transfer robot 206 in the buffer chamber 203 to transport a substrate through the opening 209.

The transfer chamber assemblies 150 may be configured the same as the one described above in relation to FIG. 1. This includes the placement and structure of the central transfer devices 145, the plurality of substrate processing assemblies 160, and the chamber pumps 165 within each of the transfer chamber assemblies 150. However, alternative embodiments of the transfer chamber assemblies 150 may be utilized.

Example Embodiments of a Reduced Volume Substrate Processing Assembly

Figure 3:
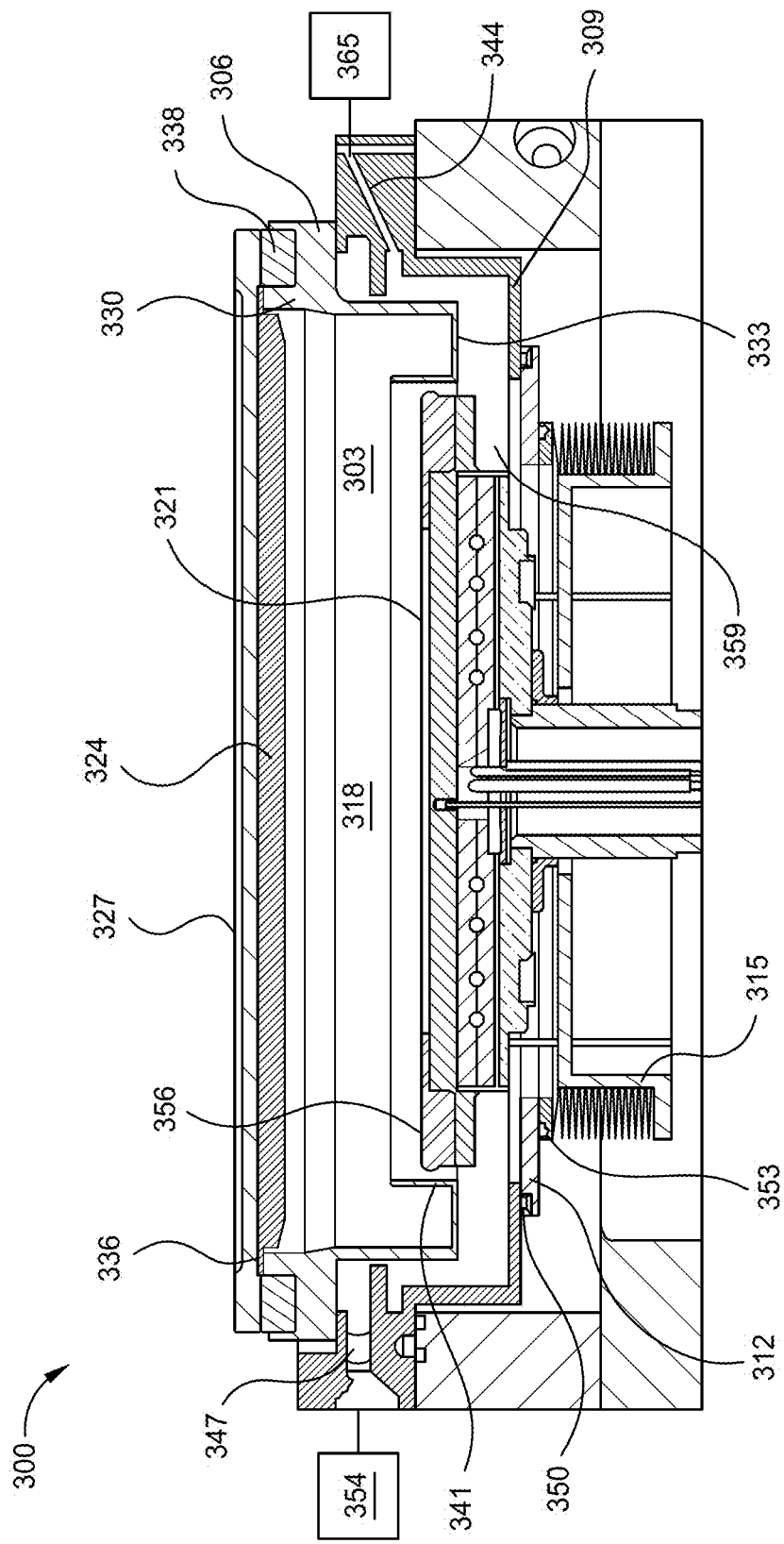
FIG. 3 depicts a semiconductor processing assembly according to certain embodiments.

FIG. 3 depicts a semiconductor processing assembly 300 according to certain embodiments. A processing volume 303 of the substrate processing assembly 300 includes a volume defined by a shield 306 and a process kit support 309. In certain embodiments, the processing volume 303 may be further defined by a sealing plate 312 and/or a top plate of a bellows 315.

The processing volume 303 includes a process space 318 located between a substrate support 321 and an opposing surface located opposite the substrate support 321 and a lower processing volume 359 below the substrate support 321 and shield 306. In certain embodiments, the opposing surface may be a target 324, while in other embodiments, the opposing surface may be an electrode 327. In certain embodiments, substrate support 321 may include a cover ring 356. Although the embodiment shown in FIG. 3 depicts an embodiment utilizing an electrode and a target, it will be appreciated by one of skill in the art that the disclosure herein may be applicable to different types of semiconductor processing chambers. In this context, the opposing surface may be a showerhead (not shown), a chamber lid enclosing the process volume, or other components of a substrate processing assembly 300 providing an opposing surface opposite the substrate support 321. Although a variety of opposing surfaces are contemplated herein, the target 324 will be discussed. In certain embodiments the processing volume 303 has a volume of 20 liters, and in some embodiments is 15 liters or less.

The processing volume 303 may be further defined by distances between various components of the substrate processing assembly 300. In some embodiments, a distance between the substrate support 321 and the target 324 may be 150 mm or less, and in some embodiments, this distance may be 35 mm or less. The processing volume 303 may be further defined by a distance between a bottom surface of the shield 306 and one of the process kit support 309 and sealing plate 312. In some embodiments, this distance may be 1 inch or less, while in other embodiments, this distance may be as low as 0.150 inches or less. In certain embodiments, the sealing plate 312 may be sealingly coupled to the process kit support 309 by an upper seal 350 and to the bellows 315 by a lower seal 353.

The shield 306 includes an upper shield 330 and a lower shield 333. The upper shield 330 is that portion of the shield 306 adjacent to the electrode 327 and target 324. In some embodiments, one or both of the electrode 327 and target 324 may be replaced by a showerhead or other lid assembly of the substrate processing assembly 300. A space between the upper shield 330 and one of the target 324 and electrode 327 defines an upper gas inlet 336 for providing one or more gases into the process space 318 of the processing volume. The upper gas inlet 336 is in fluid communication with the process space 318 as well as one or more gas sources 356 365 that provide one or more gases via the upper gas inlet 336. The substrate processing assembly 300 further includes a dielectric ring 338, disposed on the shield 306, between the upper shield 330 and the electrode 327.

The lower shield 333 extends from the upper shield 330, forming an opening in which is positioned the substrate support 321. Between the substrate support 321 and the lower shield 333 is an annular gap defining a lower gas inlet 341 through which one or more gases may be provided to the process space 318 from a gas inlet 344. Both the lower gas inlet 341 and upper gas inlet 336 may provide a variety of gases to the processing volume 303, including gases to be developed into a plasma in the processing volume 303 or remotely developed into a plasma and subsequently delivered to the processing volume 303. The lower gas inlet 341 may further serve as a pathway for one or more gases to be exhausted from the process space 318, via a pump down passage 347 coupled to a vacuum pump 354, and coupled to a single substrate processing assembly, such as substrate processing assembly 300. Pump down passage 347 may further serve to provide a low pressure environment to the processing volume 303, such as 20 mTorr to as low as 10-^8 Torr.

By providing a dedicated vacuum pump coupled to pump down passage 347, which in certain embodiments is an 80 liter turbopump, the processing volume 303 is fully cycled (introduce processing gases, brought to a desired pressure, evacuated) in 5 seconds or less and in some embodiments in 3 seconds. In this context, dedicated indicates that the vacuum pump services a single substrate processing assembly and is not coupled to multiple substrate processing assemblies, according to certain embodiments. As substrate processing assembly 300 may be fully cycled in a short amount of time, a chamber cleaning process may be used in the substrate processing assembly 300, fully cycling the pressure and introducing one or more reactive/non-reactive cleaning gases.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate comprising:
a shield comprising:
an upper shield; and
a lower shield;
a process kit support, the shield disposed on the process kit support;
a substrate support configured to be disposed opposite an electrode, the substrate support disposed 40 mm or less from a target the electrode, the process kit support coupled to the substrate support by a seal plate, the substrate support radially surrounded by the lower shield;
a process volume defined by the shield and the process kit support, the process volume having a volume of 20 liters or less;
an upper gas inlet positioned above the substrate support, adjacent the an electrode and configured to be in fluid communication with a gas source;
a supply inlet disposed radially outward of the shield;
an annular gap disposed between the substrate support and the lower shield, the annular gap being in fluid communication with the process volume, the annular gap configured to allow gas to flow from the supply inlet, through the annular gap, adjacent to the substrate support and into the process volume; and
a pump down passage disposed between the annular gap and the upper gas inlet, the pump down passage disposed through the process kit support, wherein the annular gap is configured to allow gas to exhaust from the process volume to the pump down passage through the annular gap.

2. The apparatus of claim 1, wherein the process volume is less than 15 liters.

3. The apparatus of claim 1, further comprising a pump coupled to the process volume, configured to cycle pressure of the process volume from a pre-process pressure to a process pressure and back to the pre-process pressure in less than 5 seconds.

4. The apparatus of claim 3, wherein the pump is configured to cycle pressure of the process volume in less than 3 seconds.

5. The apparatus of claim 2, wherein the annular gap is positioned adjacent to a cover ring positioned on the substrate support.

6. An apparatus for processing a substrate comprising:
a substrate support configured to be positioned 40 mm or less from a target;
a process volume containing the substrate support, the process volume, defined by a shield and a process kit support, being 20 liters or less, the shield disposed on the process kit support, the process kit support coupled to the substrate support by a sealing plate;
a plurality of gas inlets comprising:
a first one of the plurality of gas inlets configured to be positioned adjacent to the target;
a second one of the plurality of gas inlets positioned adjacent to the substrate support, the second one of the plurality of gas inlets forming an annular gap between the substrate support and the shield; and
a supply inlet disposed radially outward of the shield; and
a pump down passage disposed between the first one of the plurality of gas inlets and the second one of the plurality of gas inlets, the pump down passage disposed through the process kit support, the annular gap configured to allow gas to flow from the supply inlet and into the process volume through the annular gap and the annular gap configured to allow gas to flow from the process volume to the pump down passage through the annular gap.

7. The apparatus of claim 6, wherein the substrate support is configured to be positioned 35 mm or less from the target.

8. The apparatus of claim 7, wherein the process volume is less than 15 liters.

9. The apparatus of claim 8, wherein the sealing plate further defines the process volume.

10. The apparatus of claim 6, further comprising a pump coupled to the process volume.

11. The apparatus of claim 10, wherein the pump is configured to cycle pressure of the process volume from a pre-process pressure to a process pressure and back to the pre-process pressure in less than 5 seconds.

12. The apparatus of claim 11, wherein the pump is configured to cycle pressure of the process volume in less than 3 seconds.

13. An apparatus for processing a substrate comprising:
a shield comprising:
an upper portion disposed adjacent an electrode; and
a lower portion extending from the upper portion;
a process kit support, the shield disposed on the process kit support;
a substrate support configured to be positioned 40 mm or less from a target the electrode, the process kit support coupled to the substrate support by a seal plate, wherein an annular gap is defined by the lower portion of the shield and the substrate support;
a process volume defined by the shield and the process kit support, the process volume being 20 liters or less;
a first supply inlet disposed radially outward of the shield, the annular gap configured to allow passage of one or more gases adjacent to the substrate support from the first supply inlet to the process volume through the annular gap;
a second supply inlet disposed adjacent to the electrode;
a pump coupled to the process volume, configured to cycle pressure of the process volume from a pre-process pressure to a process pressure and back to the pre-process pressure in less than 5 seconds; and
a pump down passage disposed between the upper portion and the lower portion, the pump down passage disposed through the process kit support, the annular gap configured to allow exhaust of the one or more gases from the process volume to the pump down passage through the annular gap.

14. The apparatus of claim 13, further comprising a target, wherein the substrate support is configured to be positioned at 35 mm or less from the target, and wherein the process volume is less than 15 liters.

15. The apparatus of claim 14, wherein a bottom surface of the shield is positioned at 1 inch to 0.15 inches from the process kit support.

16. The apparatus of claim 6, wherein the shield comprises:
   an upper portion disposed adjacent an electrode; and
   a lower portion extending from the upper portion, wherein the pump down passage is positioned between the upper portion and the lower portion.

17. The apparatus of claim 13, further comprising an upper gas inlet, wherein the pump down passage is disposed between the annular gap and the upper gas second supply inlet.

18. The apparatus of claim 1, wherein the process volume is further defined by a bellows, the bellows coupled to the process kit support by a lower seal.

19. The apparatus of claim 9, further comprising a bellows coupled to the process kit support by the sealing plate.

20. The apparatus of claim 1, wherein the supply inlet is disposed through the process kit support, the supply inlet configured to allow gas to flow to the process volume from the supply inlet through the annular gap.

* * * * *